(12) United States Patent
Huang et al.

(10) Patent No.: US 8,059,425 B2
(45) Date of Patent: Nov. 15, 2011

(54) INTEGRATED CIRCUIT MODULE WITH TEMPERATURE COMPENSATION CRYSTAL OSCILLATOR

(75) Inventors: Chung-Er Huang, Taipei (TW); Chien-Yu Huang, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 830 days.

(21) Appl. No.: 12/153,907

(22) Filed: May 28, 2008

(65) Prior Publication Data

US 2009/0296361 A1     Dec. 3, 2009

(51) Int. Cl.
*H03B 1/00*     (2006.01)

(52) U.S. Cl. ........ 361/783; 361/720; 361/728; 361/753; 331/68; 331/69; 331/176; 310/344; 310/346; 310/348

(58) Field of Classification Search ............. 361/728, 361/730, 736, 739, 752, 760–764, 800, 807, 361/812, 816, 818; 310/313 R, 321, 340, 310/343, 348, 315, 346, 352, 370, 367, 364, 310/365; 331/66, 68, 69, 158, 116 R, 108 C, 331/108 D, 176, 177; 455/66, 74, 82, 83, 455/90, 347, 348, 550, 575; 29/25.35, 80, 29/417, 594, 854, 831, 832, 840, 846; 174/17 R, 174/17 SF, 50.5, 50.51, 50.62, 250, 255, 174/258

See application file for complete search history.

(56) References Cited

U.S. PATENT DOCUMENTS

| | | | | |
|---|---|---|---|---|
| 3,662,150 A * | 5/1972 | Hartung | ........................ | 219/209 |
| 4,213,104 A * | 7/1980 | Cullen et al. | .................. | 333/150 |
| 4,362,961 A * | 12/1982 | Gerber | ........................ | 310/370 |
| 4,480,148 A * | 10/1984 | Archer | .............................. | 174/51 |
| 5,640,746 A * | 6/1997 | Knecht et al. | ................. | 29/25.35 |
| 5,919,383 A * | 7/1999 | Beguin et al. | ................. | 219/209 |
| 5,920,142 A * | 7/1999 | Onishi et al. | ............... | 310/313 R |
| 6,031,318 A * | 2/2000 | Sunaga et al. | ................ | 310/340 |
| 6,154,940 A * | 12/2000 | Onishi et al. | ................. | 29/25.35 |
| 6,208,213 B1 * | 3/2001 | Anastasyev et al. | ............ | 331/69 |
| 6,362,700 B1 * | 3/2002 | Fry | ................................. | 331/176 |
| 6,446,316 B1 * | 9/2002 | Furbacher et al. | .......... | 29/25.35 |
| 6,487,085 B1 * | 11/2002 | Kimura et al. | ................ | 361/763 |
| 6,541,897 B2 * | 4/2003 | Endoh | ........................... | 310/344 |
| 6,621,379 B1 * | 9/2003 | Goetz et al. | .................... | 333/193 |
| 6,628,048 B2 * | 9/2003 | Moon et al. | .................... | 310/348 |
| 6,664,864 B2 * | 12/2003 | Jiles et al. | ...................... | 331/176 |
| 6,731,180 B1 * | 5/2004 | Clark et al. | ..................... | 331/176 |
| 6,750,729 B2 * | 6/2004 | Kim et al. | ....................... | 331/176 |
| 6,759,913 B2 * | 7/2004 | Biernacki | ........................ | 331/68 |
| 6,960,870 B2 * | 11/2005 | Kikushima et al. | ............ | 310/344 |
| 6,976,295 B2 * | 12/2005 | Kikushima et al. | .......... | 29/25.35 |
| 7,067,966 B2 * | 6/2006 | Tanaya | ............................ | 310/367 |
| 7,088,032 B2 * | 8/2006 | Oita et al. | ....................... | 310/343 |

(Continued)

FOREIGN PATENT DOCUMENTS

EP          0998021 A1 *     5/2000

(Continued)

*Primary Examiner* — Michail V Datskovskiy

(74) *Attorney, Agent, or Firm* — Rosenberg, Klein & Lee

(57) ABSTRACT

An integrated circuit module with temperature compensation crystal oscillator (TCXO) applying to an electronic device comprises: one substrate having one top surface; one temperature compensation crystal oscillator (TCXO) disposed on the top surface; at least one chip disposed on the top surface; one encapsulating piece formed on the top surface for covering the TCXO and the chip. As above-described structure, TCXO is prevented from exchanging heat due to the temperature difference so that the stability of the TCXO is improved.

12 Claims, 4 Drawing Sheets

U.S. PATENT DOCUMENTS

| | | | |
|---|---|---|---|
| 7,279,824 B2 * | 10/2007 | Tanaya et al. | 310/344 |
| 7,557,491 B2 * | 7/2009 | Kigawa et al. | 310/344 |
| 7,659,618 B2 * | 2/2010 | Dangelmaier et al. | 257/728 |
| 2003/0061693 A1 * | 4/2003 | Kikushima et al. | 29/25.35 |
| 2007/0024161 A1 * | 2/2007 | Koyama et al. | 310/348 |
| 2007/0268078 A1 * | 11/2007 | Lee | 331/68 |

FOREIGN PATENT DOCUMENTS

| | | | |
|---|---|---|---|
| JP | 402122707 A * | 5/1990 |
| JP | 405327352 A * | 12/1993 |
| JP | 409260948 A * | 10/1997 |
| JP | 02002222896 A * | 8/2002 |

* cited by examiner

US 8,059,425 B2

INTEGRATED CIRCUIT MODULE WITH TEMPERATURE COMPENSATION CRYSTAL OSCILLATOR

BACKGROUND OF THE INVENTION

1. Field of the Invention

The present invention relates to an integrated circuit module with temperature compensated crystal oscillator (TCXO). The invention in particular relates to a packaging structure of the integrated circuit module for covering the TCXO.

2. Description of Prior Art

A temperature compensated crystal oscillator (TCXO) is widely applied in the applications of cell phone and global positioning system (GPS). For example, TCXO is used in small-size GPS module for compensating for the temperature difference occurring during operation. For GPS devices it is important that the clock is precise in order to determine precisely the location. If the clock of the GPS device is not precise, the GPS device can not determine the location or will calculate a wrong result. Generally speaking, the compensation value of TCXO is controlled under 0.5 ppm.

However, a TCXO is sensitive to changes of the environmental temperature. In other words, the environmental temperature has a large effect on the operation of TCXO and further influences the stability of GPS devices.

Therefore, in view of this, the inventor proposes the present invention to overcome the above problems based on his expert experience and deliberate research.

SUMMARY OF THE INVENTION

The primary object of the present invention is to provide for an integrated circuit module with temperature compensated crystal oscillator (TCXO). The present invention prevents the TCXO of the integrated circuit module from the heat exchange for increasing the operation stability of TCXO.

In order to achieve the above objects, the present invention provides an integrated circuit module with temperature compensation crystal oscillator, comprising: a substrate having a top surface; a temperature compensation crystal oscillator (TXCO) disposed on the top surface of the substrate; at least one chip disposed on the top surface of the substrate; an encapsulating piece covering the temperature compensation crystal oscillator and the chip on the top surface of the substrate; and a casing disposed on the encapsulating piece, wherein the encapsulating piece covering and the casing form a heat-insulating structure for insulating heat from the temperature compensation crystal oscillator.

In order to achieve the above objects, the present invention provides an integrated circuit module with temperature compensation crystal oscillator, comprising: a substrate, a temperature compensation crystal oscillator (TXCO) and at least one chip, the temperature compensation crystal oscillator and the chip disposed on the top surface of the substrate, the substrate having a hole thereon corresponding to the temperature compensation crystal oscillator, the temperature compensation crystal oscillator and the chip covered via a heat-insulating structure having a encapsulating piece and a casing, wherein the hole and the heat-insulating structure provides for insulating heat from the temperature compensation crystal oscillator.

TCXO is disposed inside a packaging structure so that the influence of environmental temperature different to the TCXO is decreasing and the performance of TCXO is optimized.

In order to better understand the characteristics and technical contents of the present invention, a detailed description thereof will be made with reference to accompanying drawings. However, it should be understood that the drawings and the description are illustrative but not used to limit the scope of the present invention.

DETAILED DESCRIPTION OF THE INVENTION

Figure 1:
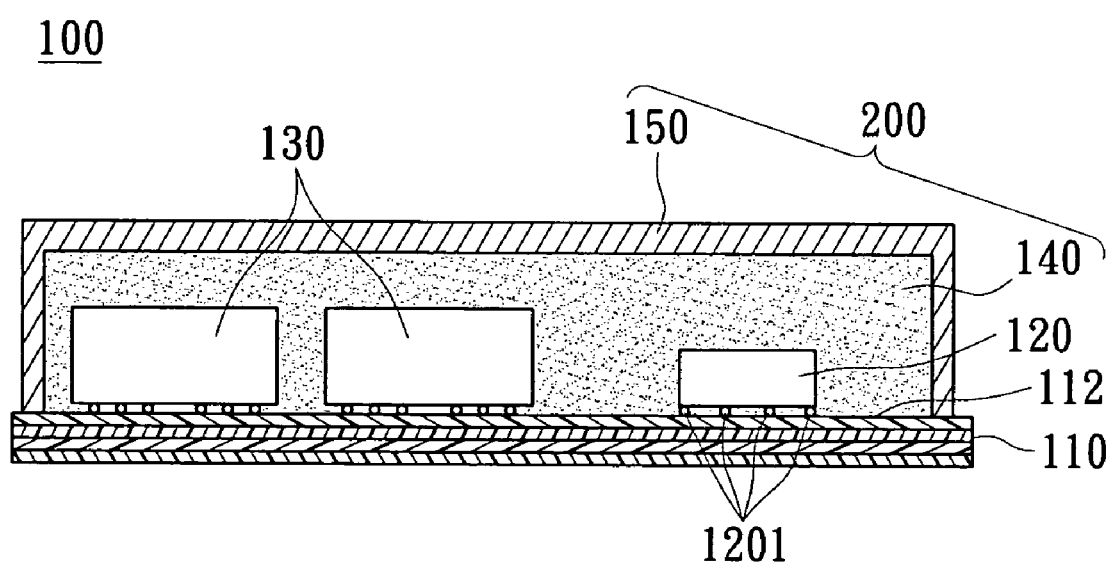
FIG. 1 shows the first embodiment of the integrated circuit module with temperature compensated crystal oscillator according to the present invention.

Please refer to FIG. 1, the invention discloses an integrated circuit module 100 with temperature compensation crystal oscillator (TCXO) applied to an electronic device such as a global positioning system (GPS) and mobile communication systems. The integrated circuit module 100 comprises a substrate 110, a temperature compensated crystal oscillator (TCXO) 120, two chips 130 and a casing 150.

The substrate 110 can be, but not restricted to, a metal frame, a printing circuit board (PCB), an aluminum substrate, a silicon substrate or a ceramic substrate. The substrate 110 has a top surface 112. In the preferable embodiment, the substrate 110 is a BT (Bismaleimide Triazine) substrate and it is a multi-layer substrate. The BT substrate has more than one resin plates and a metal plate between the resin plates. The metal plate is usually coated by a copper layer for serving as a ground reference. The upper surface of top resin plate is usually coated on nickel/gold alloy for electric connection and welding surface.

TCXO 120 is disposed on the top surface 112 of the substrate 110 and the pins 1201 of the TCXO 120 are connected electrically with the signal lines on the substrate 110. TCXO 120 offers excellent frequency stability with low power consumption to compensate the frequency-temperature characteristics inherent to the crystal unit. TCXO device offers a voltage control option which allows the frequency to be adjusted by an external control voltage for decreasing the environmental temperature effects. TCXO devices are classified into two types. One is a direct-type TCXO with a temperature compensation circuit built into the oscillation loop. The other is an indirect-type TCXO with a temperature compensation circuit outside the oscillation loop, in which the oscillation frequency is therefore indirectly controlled. The indirect-type TCXO is roughly classified into analog control method and digital control method. The indirect compensation technique is based on the use of a varactor diode in series with the crystal. The compensation network consisting of a two or three thermistors and resistors provide the varactor diode the compensating voltage over the operating temperature range of the TCXO so that the resulting change in the varactor diode capacitance corrects for the frequency drift due to the temperature. On the other hand, the direct-type TCXO is characterized that the crystal is placed in the feedback path of an amplifier and a capacitor is used as a reactive element in series with the resonant current path of the crystal, which shifts the crystal frequency. By using thermistors as switches, the temperature extremes of the crystal can be compensated by switching in or out the reactive element in the oscillator circuit.

The integrated circuit module 100 has two chips 130. The chips 130, for example, are a baseband chip and a radio frequency chip. The baseband chip provides for processing signals and has microprocessor (MPU), memory module (Dynamic Random Access Memory module, Static Random Access Memory module or flash module), power manager, processor peripherals and clock module. The ratio frequency chip provides for receiving signals and has amplifier, filter, low noise block downconverter (LNB), frequency synthesizer, oscillator and antenna module. The above-mentioned modules can be produced on the substrate 110 by surface mount technology (SMT), through hole connection, ball grid array (BGA), land grid array (LGA), column grid array (CGA), plastic ball grid array (PBGA) and so on. The integrated circuit module 100 can be produced by semiconductor processes including lithograph, etching and deposition processes and the above-described methods are familiar to those skilled in this art.

An encapsulating piece 140 is formed by a thermosetting material, such as glue, and the glue covers the TCXO 120 and the two chips 130 on the on the top surface 112 of the substrate 110. The encapsulating piece 140 provides for a heat-insulating property for isolating the TCXO 120 in a steady environment so that the performance of the TCXO 120 is improved.

The casing 150 is a metal casing with electromagnetic interference (EMI) shielding and heat-conductibility and the casing 150 covers the encapsulating piece 140 on the top surface 112 of the substrate 110. The casing 150 and the encapsulating piece 140 serve as packaging body for the integrated circuit module 100 and form a heat-insulating structure 200 for insulating heat from the TCXO 120. The TCXO 120 is covered by the heat-insulating structure 200 and the TCXO 120 is presented from heat exchange. In other words, the heat of the TCXO 120 does not easily transfer to the environment and vice versa so that the temperature of the space containing the TCXO 120 maintains at a predetermined value.

Figure 2:
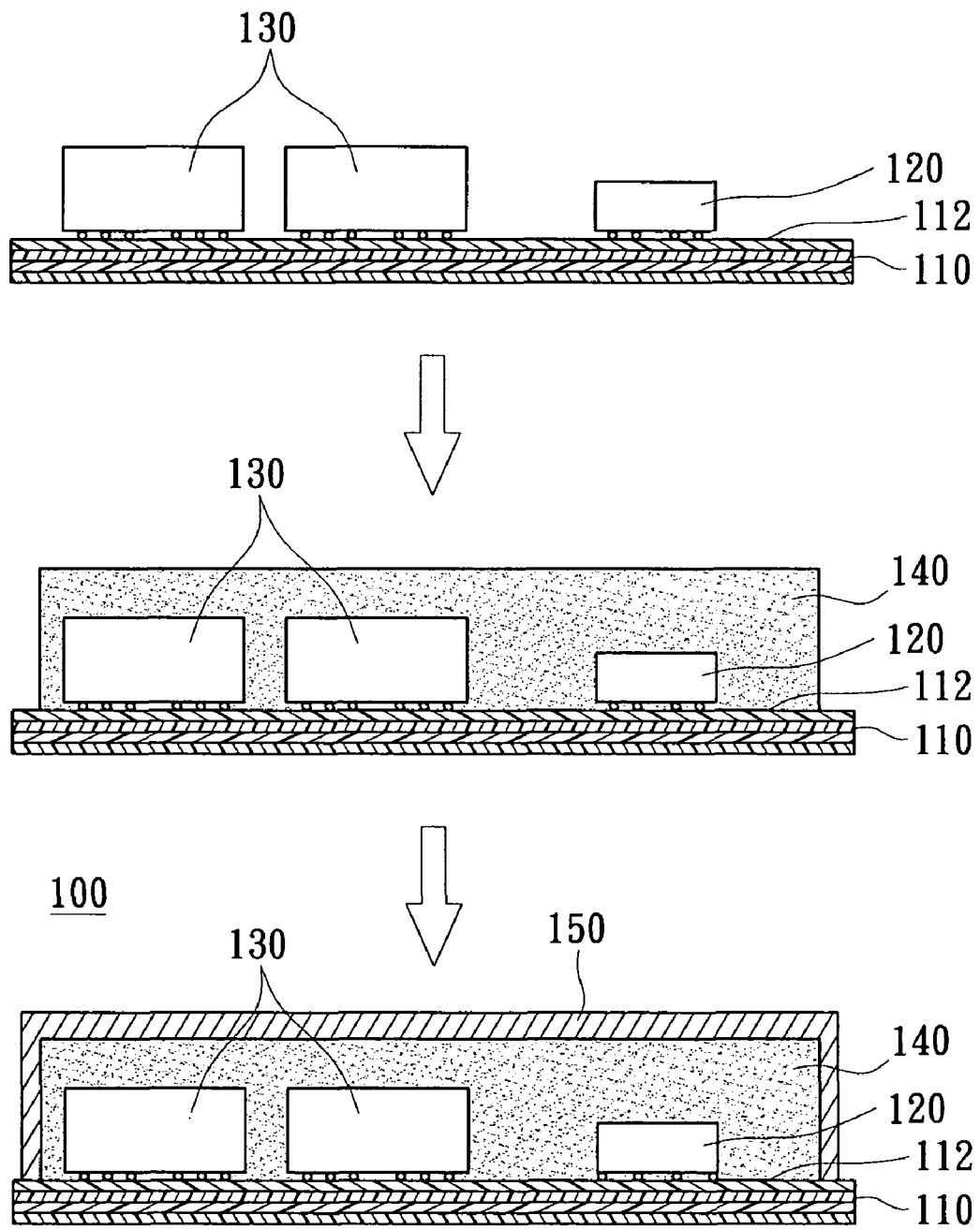
FIG. 2 is a perspective view showing the steps for manufacturing the integrated circuit module with temperature compensated crystal oscillator according to the present invention.
Figure 3:
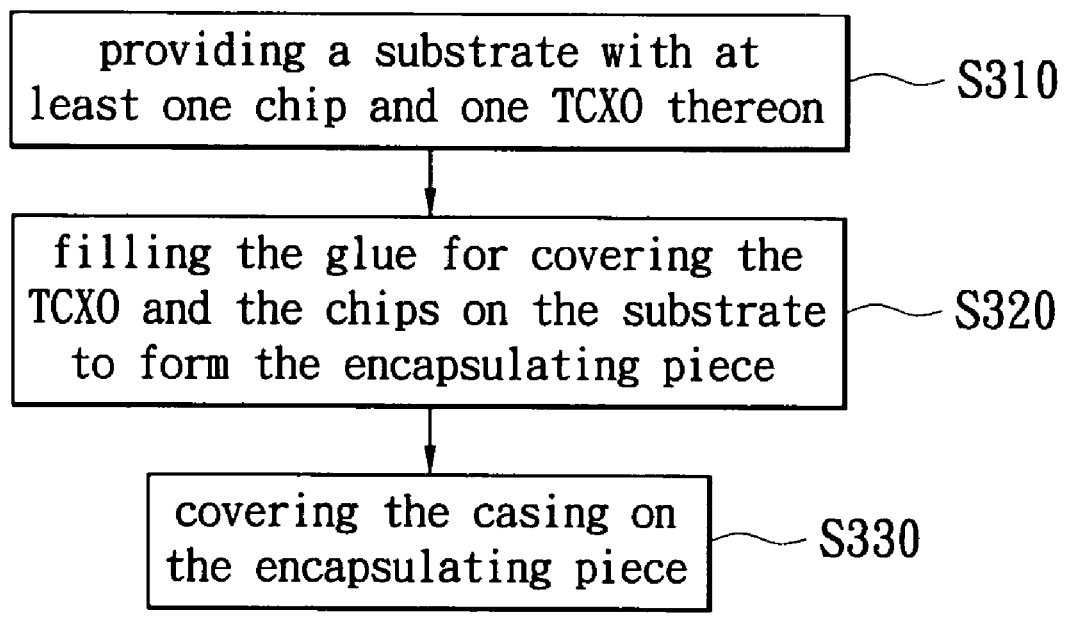
FIG. 3 is a flow chart showing the method for manufacturing the integrated circuit module with temperature compensated crystal oscillator according to the present invention.

Please refer to FIGS. 2-3, the method S300 for manufacturing the integrated circuit module 100 is disclosed. The method S300 comprises step S310 to S330, and the steps will be described hereinafter.

Step 310 is providing for a substrate 110 and the substrate 110 has at least one chip 130 and one TCXO 120 thereon. Please note that two chips 130 are drawn in the figures.

Step 320 is filling the glue for covering the TCXO 120 and the two chips 130 on the top surface 112 of the substrate 110 in order to form the encapsulating piece 140.

Step 330 is covering the encapsulating piece 140 on the top surface 112 of the substrate 110 by casing 150 in order to insulate the TCXO 120 from the environment. The casing 150 and the encapsulating piece 140 form a heat-insulating structure 200 for insulating heat from the TCXO 120.

Figure 4:
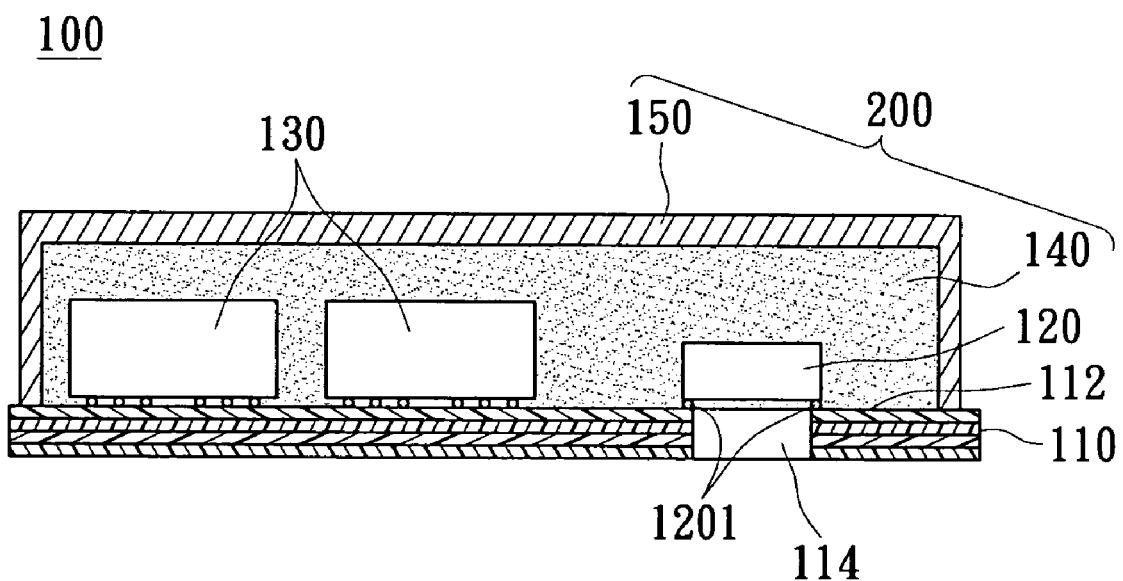
FIG. 4 shows the second embodiment of the integrated circuit module with temperature compensated crystal oscillator according to the present invention.

The second embodiment is shown in FIG. 4. In the second embodiment, the substrate 110 further comprises at least one hole 114. Please note there is a hole 114 shown in FIG. 4. The hole 114 is defined under the TCXO 120. The hole 114 is formed by removing the materials of the substrate 110 under the TCXO 120. As the above-mentioned layer structure of the substrate 110, the substrate 110 usually has a metal layer and metal material always dissipates heat from TCXO 120 to environment. Therefore, the metal layer of the substrate 110 under the TCXO 120 can be removed by forming the hole 114 so that the working temperature of the TCXO 120 is more stable and the performance of the TCXO 120 is optimized. Thus, the hole 114 and the heat-insulating structure 200 including the casing 150 and the encapsulating piece 140 have a function for decreasing the heat exchange. Moreover, because the pins 1201 are located on the sides of the TCXO 120, the hole 114 is preferably positioned under the geometric center of TCXO 120 and the hole 114 will not affect on the connection of the TCXO 120 and the substrate 110. However, the positions and the numbers of the holes 114 are adjustable depending on different applications.

To sum up, the TCXO 120 is disposed in the heat-insulating structure 200 and/or on the hole 114 so that the environmental temperature does not take influence on the TCXO 120 and the performance of the TCXO 120 is highly controlled.

Although the present invention has been described with reference to the foregoing preferred embodiment, it shall be understood that the invention is not limited to the details thereof. Various equivalent variations and modifications may occur to those skilled in this art in view of the teachings of the present invention. Thus, all such variations and equivalent modifications are also embraced within the scope of the invention as defined in the appended claims.

What is claimed is:

1. A communication system with a temperature compensated crystal oscillator, comprising:
    a substrate having a top surface;
    a temperature compensation crystal oscillator (TXCO) disposed on the top surface of the substrate;
    at least one baseband chip and at least one radio frequency chip respectively disposed on the top surface of the substrate;
    an encapsulating piece covering the temperature compensation crystal oscillator, the baseband chip and the radio frequency chip on the top surface of the substrate; and
    a casing disposed on the encapsulating piece, wherein the encapsulating piece and the casing form a heat-insulating structure for insulating heat from the temperature compensation crystal oscillator.

2. The communication system with temperature compensation crystal oscillator according to claim 1, wherein the substrate further comprises at least a hole corresponding to the temperature compensation crystal oscillator.

3. The communication system with temperature compensated crystal oscillator according to claim 2, wherein the hole is positioned under a geometric center of the temperature compensated crystal oscillator.

4. The communication system with temperature compensation crystal oscillator according to claim 3, wherein the substrate is a metal frame, a printing circuit board (PCB), an aluminum substrate, a silicon substrate or a ceramic substrate.

5. The communication system with temperature compensated crystal oscillator according to claim 3, wherein the casing is a metal casing with electromagnetic interference (EMI) shielding and heat-conductibility.

6. The communication system with temperature compensated crystal oscillator according to claim 3, wherein the encapsulating piece is made from thermosetting material.

7. An communication system with temperature compensation crystal oscillator, comprising: a substrate, a temperature compensation crystal oscillator (TXCO), at least one baseband chip and at least one radio frequency chip, the temperature compensation crystal oscillator, the baseband chip and the radio frequency chip being disposed on the top surface of the substrate, the substrate having a hole thereon corresponding to the temperature compensation crystal oscillator, the temperature compensation crystal oscillator, the baseband chip and the radio frequency chip being covered by a heat-insulating structure having an encapsulating piece and a casing, wherein the hole and the heat-insulating structure provide for insulating heat from the temperature compensation crystal oscillator.

8. The communication system with temperature compensated crystal oscillator according to claim 7, wherein the hole is positioned under a geometric center of the temperature compensated crystal oscillator.

9. The communication system with temperature compensated crystal oscillator according to claim 7, wherein the encapsulating piece covers the temperature compensated crystal oscillator, the baseband chip and the radio frequency chip, and the casing covers the encapsulating piece.

10. The communication system with temperature compensation crystal oscillator according to claim 9, wherein the substrate is a metal frame, a printing circuit board (PCB), an aluminum substrate, a silicon substrate or a ceramic substrate.

11. The communication system with temperature compensated crystal oscillator according to claim 9, wherein the casing is a metal casing with electromagnetic interference (EMI) shielding and heat-conductibility.

12. The communication system with temperature compensated crystal oscillator according to claim 9, wherein the encapsulating piece is made from thermosetting material.

\* \* \* \* \*